(12) United States Patent
Fujiwara et al.

(10) Patent No.: US 6,877,078 B2
(45) Date of Patent: Apr. 5, 2005

(54) INFORMATION PROCESSING SYSTEM WITH MEMORY ELEMENT PERFORMANCE-DEPENDENT MEMORY CONTROL

(75) Inventors: Hirokatsu Fujiwara, Fishkill, NY (US); Kimiko Mita, Hadano (JP)

(73) Assignee: Hitachi, Ltd., Tokyo (JP)

( * ) Notice: Subject to any disclaimer, the term of this patent is extended or adjusted under 35 U.S.C. 154(b) by 388 days.

(21) Appl. No.: 09/826,887

(22) Filed: Apr. 6, 2001

(65) Prior Publication Data

US 2001/0056521 A1 Dec. 27, 2001

(30) Foreign Application Priority Data

Apr. 6, 2000 (JP) ........................................ 2000-105201

(51) Int. Cl.[7] .............................................. G06F 12/00
(52) U.S. Cl. ...................................... 711/167; 711/154
(58) Field of Search ................................. 711/154, 167, 711/105; 365/211, 212; 713/401

(56) References Cited

U.S. PATENT DOCUMENTS 5,860,129 A * 1/1999 Moyer et al. ............... 713/500
6,173,217 B1 * 1/2001 Bogin et al. ................ 700/299
6,373,768 B2 * 4/2002 Woo et al. .................. 365/211
6,467,048 B1 * 10/2002 Olarig et al. ................. 714/7
6,484,232 B2 * 11/2002 Olarig et al. ............... 711/105
6,601,130 B1 * 7/2003 Silvkoff et al. ................ 711/5

* cited by examiner

*Primary Examiner*—Reba I. Elmore
(74) *Attorney, Agent, or Firm*—Antonelli, Terry, Stout & Kraus, LLP

(57) ABSTRACT

An information processing system which self-detects a change in the actual performance of memory elements due to mounting positions, change in environment, and aging changes to enable the memory elements to stably operate at the highest possible performance without shutting down the system. For implementing an optimal memory access for each of memory elements mounted in a memory unit, a memory controller is provided with a memory timing table which stores operation timings corresponding to the respective memory elements. The timing table is updated in response to an instruction from an apparatus for monitoring the memory operation, and the updated table is applied to a processing request after the update instruction. The apparatus for monitoring the memory operation includes an environmental sensor disposed around the memory elements, a counter for accumulating error information which is generated each time the memory unit is accessed, and so on.

11 Claims, 4 Drawing Sheets

CONTENTS OF MEMORY TIMING TABLE

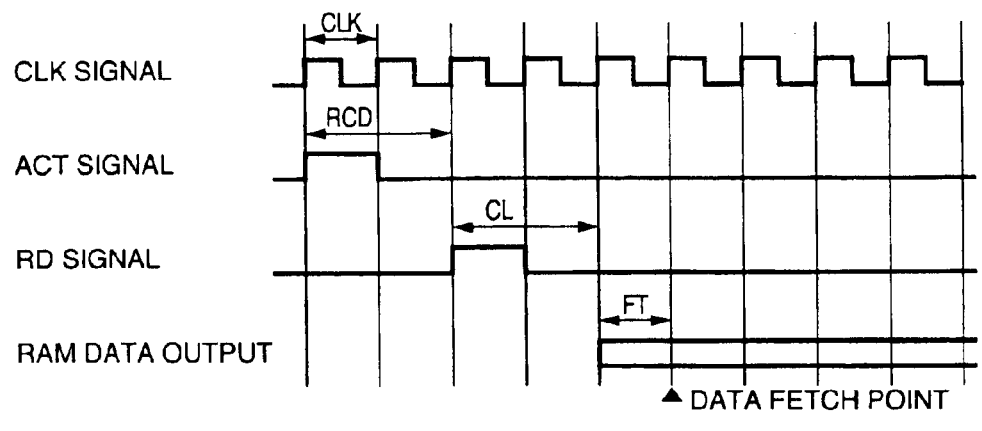
SDRAM OPERATION TIMING AT MOUNTING POSITION A
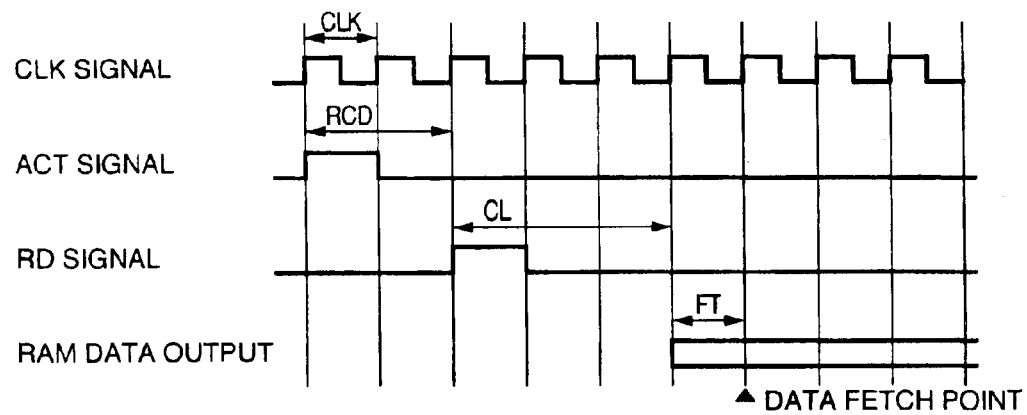
SDRAM OPERATION TIMING AT MOUNTING POSITION B

SDRAM OPERATION TIMING AT MOUNTING POSITION C

SDRAM OPERATION TIMING AT MOUNTING POSITION D

INFORMATION PROCESSING SYSTEM WITH MEMORY ELEMENT PERFORMANCE-DEPENDENT MEMORY CONTROL

BACKGROUND OF THE INVENTION

The present invention relates to an information processing system, and more particularly, to an information processing system having a memory controller which can control a memory unit in accordance with the performance of memory elements mounted therein.

Generally, an information processing system employs a DRAM (Dynamic Random Access Memory) element, an SRAM (Static Random Access Memory) element and so on as memory elements which constitute a storage device of the system. In recent years, SDRAM (Synchronous DRAM) and SSRAM (Synchronous SRAM), which operate in synchronism with a clock signal, are also used in wide applications. Memory elements have been improved in access speed and memory capacity in the last several years, and their prices also vary along with the improvements. A system such as an information processing system must be designed such that it can support future elements in order to maintain a long product lifetime. For this reason, an information processing system comprising a storage device generally has a register for determining an operation timing in a memory controller in order to support a plurality of kinds of elements. An operation timing value is set in the register in accordance with the type and operating speed of a particular element, causing the memory controller to output a control signal in accordance with the set value. In addition, the memory controller provides an extra address signal for possible expansion of the memory capacity.

In recent years, information processing systems tend to be required to have an increasingly larger memory capacity, so that it is necessary to not only employ the recent possible memories providing the largest possible capacity and the highest possible speed but mount memory elements as many as possible. However, an information processing system comprising a large capacity of memory has an increased number of memory elements mounted therein for implementing a large scaled memory unit, resulting in an increase in a spatial extension on the unit and variations from one element to another. Consequently, the information processing system fails to exhibit the actual performance and capability of the elements. As such, an information processing system equipped with a large number of memory elements needs to mount and control the memory elements for accommodating the worst conditions in consideration of the trade-off or compromising between the performance and capacity of the mounted memory elements.

In addition, an information processing system equipped with a large amount of memory elements would encounter a problem if any memory element mounted therein fails. Failures of memory elements may be classified into a completely intermittent fault such as an α-ray fault, and a solid fault, i.e., a completely broken memory element. However, not a few failures of elements result from an insufficient timing margin for a particular parameter when the system is operating at a certain operation timing in an operating environment. Conventionally, such failures of memory elements have not been particularly identified and have been treated as solid failures if the memory elements repetitively fail.

Furthermore, since a high performance information processing system equipped with a large amount of memory elements requires large power consumption, a power save mode such as a sleep mode is provided for pausing the operation of memories when a memory unit is not operated.

JP-A-2-234243 discloses a main storage device which comprises means for identifying whether an access is made to a main storage comprised of DRAMs having a high speed access time or a main storage comprised of DRAMs having a low speed access time to automatically switch the memory access timing in a main storage controller.

As described above, an information processing system equipped with large scaled memory elements requires a fine management for the performance of mounted memory elements in order to ensure the capacity, performance and reliability of the memory elements. Conventionally, however, such an aspect has not been taken into account. Specifically, the information processing system equipped with large scaled memory elements may experience an increase in a spatial expansion of the memory elements in a memory unit due to an increase in the number of mounted memory elements, variations in transfer timing from one memory element to another, increased variations in the actual performance of the memory elements due to different environments such as the temperature in a place in which the system is installed, and a degradation of the actual performance of the memory elements due to aging changes and so on. However, the information processing system does not finely manage the memory elements for accommodating these considerations, and therefore fails to sufficiently make use of the capabilities of the memory elements.

SUMMARY OF THE INVENTION

It is an object of the present invention to provide an information processing system comprising a memory controller which is capable of self-detecting positions at which memory elements are mounted, and variations in the capacities of the memory elements, temporary changes in environment, and a change in the actual performance of the memory elements associated with aging change to stably operate the memory elements at the highest possible performance without the need for shutting down the system in making a recovery of the performance.

It is another object of the present invention to provide an information processing system comprising a memory controller which is capable of changing a particular operation timing for a memory element which is degraded only in terms of the operation timing to continue a stable operation without the need for shutting down the system and capable of temporarily reducing the operation performance of the memory elements for saving the power under the control of a program.

To achieve the above objects, according to one aspect of the present invention, there is provided an information processing system which comprises at least one memory unit and a memory controller, wherein the memory controller includes storing means for storing changeable memory control timing information, monitoring means for monitoring an operating state of the memory unit, a register for fetching memory control timing information from the memory control timing information storing means, and control means for controlling an access to the memory unit based on the memory control timing information in the register, and for changing information stored in the memory control timing information storing means based on information from the monitoring means.

According to another aspect of the present invention, in the information processing system, the memory unit is mounted with a mixture of a plurality of groups of memory elements different in operation, wherein the storing means for storing the memory control timing information stores the memory control timing information corresponding to each of the groups of memory elements. The memory unit includes an environmental sensor for monitoring a temperature and a current, wherein the change control means updates the information stored in the storing means so as to delay an operation timing to the memory unit in response to a notification from the environmental sensor indicating that a temperature rise around the memory or a current value exceeds a reference value.

According to a further aspect of the present invention, in the foregoing system, the memory controller includes a memory fault detector circuit for detecting a fault in the groups of memory elements. When the fault detector circuit detects that a particular group of memory elements fails, the control means updates stored information corresponding to the group of memory element in the storing means so as to delay an operation timing to the memory unit.

According to a further aspect of the present invention, in the foregoing system, the memory controller includes a memory fault detector circuit for detecting a fault in the groups of memory elements. When the fault detector circuit detects that a particular group of memory elements fails and that the fault indicates degraded performance in a particular operation, the control means updates stored information corresponding to the group of memory elements in the storing means so as to delay an operation timing to the memory unit.

Other objects, features and advantages of the present invention will become apparent from the following description of the embodiments of the invention taken in conjunction with the accompanying drawings.

BRIEF DESCRIPTION OF THE DRAWINGS

FIGS. 4A and 4B are timing charts for explaining operation timings associated with an access to the memory unit.

DETAILED DESCRIPTION OF THE EMBODIMENTS

An embodiment of the present invention will hereinafter be described in detail with reference to the accompanying drawings.

Figure 1:
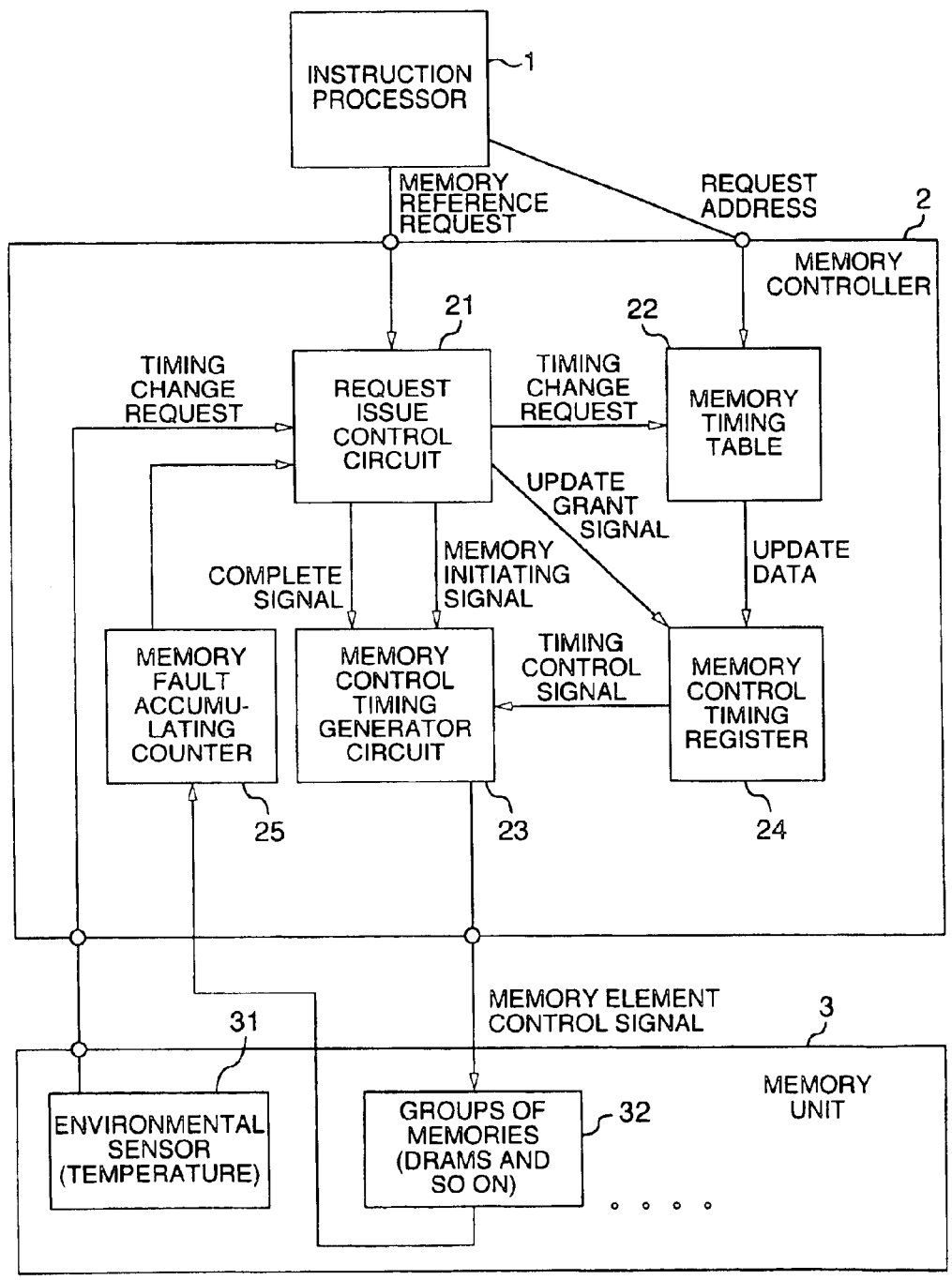
FIG. 1 is a block diagram illustrating the configuration of an information processing system according to one embodiment of the present invention.

FIG. 1 illustrates in a block diagram form the configuration of an information processing system according to an embodiment of the present invention. The information processing system illustrated in FIG. 1 comprises an instruction processor 1; a memory controller 2; a memory unit 3; a request issue control circuit 21; a memory timing table 22; a memory control timing generator circuit 23; a memory control timing register 24; a memory fault accumulating counter 25; an environmental sensor 31; and groups of memories 32.

As can be seen in FIG. 1, the information processing system according to the embodiment of the present invention is generally divided into the instruction processor 1 for executing instructions; the memory controller 2 for controlling the memory unit 3; and the memory unit 3. The memory controller 2 comprises the request issue control circuit 21 for controlling the issuance of a variety of requests including reference, update and so on, changing a memory control timing based on information from the memory fault accumulating counter 25 and detection information indicative of a temperature around the memories and a current from the environmental sensor 31, and updating contents of the memory timing table 22; the memory timing table 22 for registering memory reference timings; the memory control timing generator circuit 23 for generating a signal for controlling memories such as SDRAM and so on; the memory control timing register 24 which is referenced by the timing generator circuit 23 to generate a memory control timing; and the memory fault accumulating counter 25 for accumulating information on memory errors. The memory unit 3 includes the groups of memories 32 such as DRAMs; and the environmental sensor 31 which functions as a temperature/current sensor for monitoring the temperature around the memories and the amount of current flowing through the memories.

Figures 2, 3:
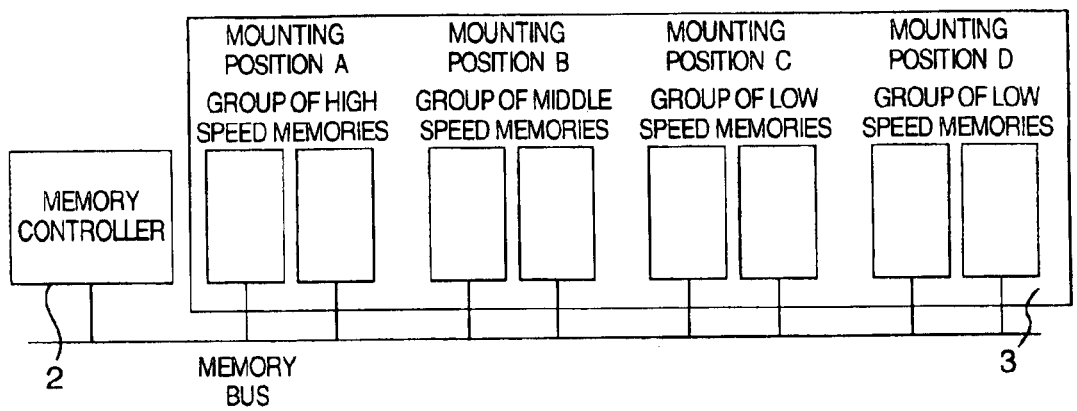
FIG. 2 is a diagram for explaining a structure for mounting groups of memories which constitute a memory unit.
FIG. 3 is a table for explaining exemplary structure of a memory timing table.

The groups of memories 32 can be comprised of memory elements which are different in type and operating speed from one another. For example, as illustrated in FIG. 2, groups of memory elements different in the operating speed are mounted at their respective positions separate from one another. In the example illustrated in FIG. 2, a group of high speed memory elements is positioned at a mounting position A nearest from the memory controller 2; a group of middle speed memory elements is positioned at a mounting position B next nearest from the memory controller 2; and two groups of low speed memory elements are positioned at mounting positions C, D furthest away from the memory controller 2. While in the example illustrated in FIG. 2, memory elements are divided into four groups of memory elements and mounted at four separate mounting positions, the number of groups into which the memory elements are divided, and the number of mounting positions can be arbitrarily selected.

Turning back to FIG. 1, the memory fault accumulating counter 25 comprises a plurality of accumulating counters, each of which is responsive to fault information from the memory unit 3 to count up the fault. In this event, each of the accumulating counters counts faults for each set of a situation in which a fault occurred and an associated group of memory elements which has failed. For this purpose, though not shown, the memory controller 2 is provided therein with a fault identifying circuit for identifying, from fault information from the memory unit 3, a situation in which a fault occurred, for example, in which sequence of commands the fault occurred, and for identifying which group of memory elements failed.

In the information processing system according to the embodiment of the present invention configured as described above, a normal memory reference request is issued from the instruction processor 1 to the request issue control circuit 21 in the memory controller 2. The request issue control circuit 21, upon receipt of the memory reference request, checks whether a target memory has been referenced by another request or is executing a refresh operation or the like, and requests the memory control timing generator circuit 23 to access the target memory if it is available. The memory control timing generator circuit 23 outputs a control signal to a memory element such as SDRAM, which constitutes the memory unit 3, based on a parameter set in the memory control timing register 24.

Timing information included in the memory control timing register 24 is retrieved from the memory timing table 22 and set into the memory control register 24 in response to an instruction from the request issue control circuit 21. Alternatively, each time the memory unit 3 is accessed, a timing information corresponding to the access may be retrieved from the memory timing table 22 and set into the memory control timing register 24. When memory elements mounted in the memory unit 3 are SDRAMs, the timing information includes parameters which indicates the cycle of a clock for controlling the SDRAMs (CLK); a time period (RCD) taken from the issuance of a command for activating the S(Synchronous)DRAMs (ACT) and sending a row address to the delivery of a column address; a time period (CL) from the receipt of the column address to output of data from an SDRAM; a time period (FT) taken until the data outputted from the SDRAM is routed through a substrate on which memory elements are mounted and fetched into the memory controller 2; and so on. RD signal is a read signal.

These parameters depend on the type of particular memory elements, and even if the memory elements are SDRAMs, by way of example, the parameters may also depend on the manufacturer and mounting form of the SDRAMs. These parameters are changed in the following sequence. First, the memory controller 2 detects a change in the actual performance of the memory elements mounted in the memory unit 3, and the memory controller 2 itself rewrites the contents of the memory timing table 22. Alternatively, the memory controller 2 reports the change in the actual performance of the memory elements to the instruction processor 1 which in response rewrites the contents of the memory timing table 22.

The change in the parameters associated with the memory timing as described above results from a variety of factors as described below. The following description will be centered on those factors which cause a change in the memory control timing.

Initialization of Memories

When the groups of memory 32 in the memory unit 3 are initially mounted with a mixture of memory elements which are different from one another in specifications such as the operating speed, as illustrated in FIG. 2, it is necessary to set memory timing parameters in accordance with these memory elements. These parameters are set by initializing the memory timing table 22 upon powering on the system.

Remedy to Memory Element Subjected to Fault Occurrence

When the memory fault accumulating counter 25 detects that memory faults have occurred frequently in a particular memory element, this means a request for recovering the faults by changing the memory access timing. This is because some elements, which suffer from the memory fault, could continue the operation by changing the timing. A request may be issued for saving such memory elements. A signal for such a request is generated when a count value of the memory fault accumulating counter 25 contained in the memory controller 2 exceeds a previously determined threshold value, at which time the memory fault accumulating counter 25 notifies the request issue control circuit 21 to that effect.

Prevention of Occurrence of Fault due to Abnormal Temperature

When a change in environment such as temperature, humidity or the like occurs around the memory elements, the memory elements may experience degraded characteristics and eventually fail. In this event, it is necessary to relieve the operation timing of the memory elements so that the system can wait for the recovery of the environment. A signal for such a request is generated when the environmental sensor 31 disposed on the memory unit 3 notifies the request issue control circuit 21 of the request.

Operation in Power Save Mode

When the information processing system remains in a stand-by state with its operation frequency being reduced, a request is made to relieve the memory operation timing, i.e., extend the cycle of the operating clock to save the power. This request is made from the instruction processor 1 to the request issue control circuit 21 in accordance with the standby state.

Upon receipt of a memory timing change request as described above, the request issue control circuit 21 updates the memory timing table 22. This update is performed in accordance with a previously determined update rule, for example, by incrementing previously set parameter values by several percent.

As described above, an update to the memory timing table 22 is reflected to the memory control timing register 24. The reflection of the updated memory timing table 22 to the memory control timing register 24 is performed under the control of the request issue control circuit 21.

Specifically, the request issue control circuit 21 confirms that the memory control timing generator circuit 23 is not referencing the memory control timing register 24, and issues an update grant from the memory timing table 22 to the memory control timing register 24. The memory control timing register 24, upon receipt of the update grant, receives data from the memory timing table 22, and applies new timing parameters to a memory reference for the next request onward.

The memory timing table 22 is organized as an example shown in FIG. 3. In the example shown in FIG. 3, the memory timing table 22 registers memory timing parameters for SDRAMs, which are different from one another in speed, disposed at the four mounting positions A–D as described in connection with FIG. 2. The parameters are identical to the timing information included in the memory control timing register 24, and specifically indicates the SDRAM clock cycle (CLK); the time period (RCD) taken from the issuance of a command for activating the SDRAMs and sending a row address to the delivery of a column address; the time period (CL) from the receipt of the column address to output of data from an SDRAM; and the time period (FT) taken until the data outputted from the SDRAM is routed through the substrate on which the memory elements are mounted and fetched into the memory controller 2.

The example shown in FIG. 3 is a simple structure corresponded to the mounting configuration of the memory groups illustrated in FIG. 2. Actually, however, memory timing parameters are set in the memory timing table 22, for example, for each set of a sequence of commands which frequently cause a fault, a group of memory elements in which the fault has occurred, the type of the memory elements, and so on.

As a memory reference request is issued from the instruction processor 1 to the memory controller 2, the request is accepted by the request issue control circuit 21. The request issue control circuit 21 requests the memory control timing generator circuit 23 to initiate the memory unit 3. The memory control timing generator circuit 23 reads the contents of the memory control timing register 24 in accordance with the type of the request, and outputs a control signal to the memory unit 3 at an optimal timing.

FIGS. 4A, 4B and FIGS. 5A, 5B are timing charts for explaining the operation timings associated with an access to the memory unit 3. In the following, the operation involved in controlling the memory unit 3 in accordance with the memory timing table shown in FIG. 3 will be explained with reference to FIGS. 4A, 4B and FIGS. 5A, 5B.

FIG. 4A shows operation timings of the group of memory elements at the mounting position A, wherein a CLK signal has a cycle of 10 ns. The time period RCD from an ACT signal to an RD signal is 20 ns; CL from the RD signal to output of RAM data is 20 ns; and FT from the output of the RAM data to fetch of the RAM data is 10 ns.

FIG. 4B shows operation timings of the group of memory elements at the mounting position B, wherein a CLK signal has a cycle of 10 ns. The time period RCD from an ACT signal to an RD signal is 20 ns; CL from the RD signal to output of RAM data is 30 ns; and FT from the output of the RAM data to fetch of the RAM data is 10 ns.

Figure 5A:
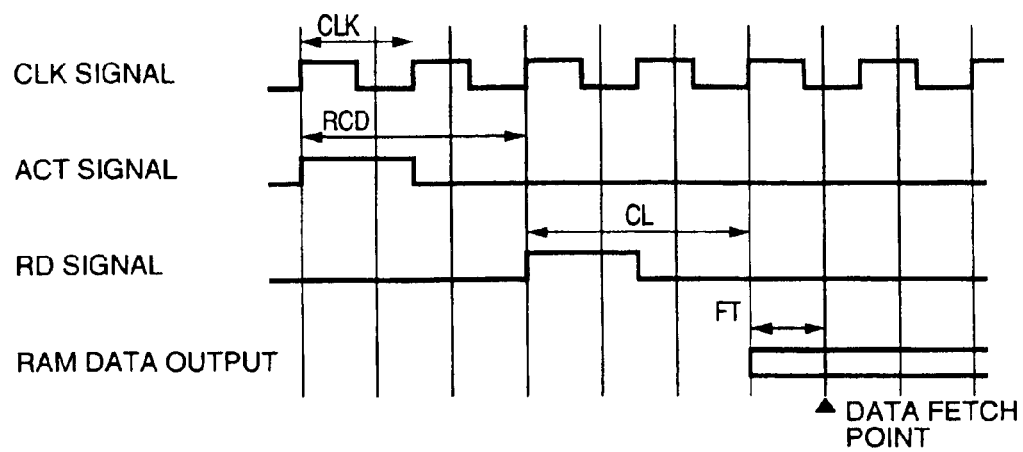
FIGS. 5A and 5B are timing charts for explaining operation timings associated with an access to the memory unit.

FIG. 5A shows operation timings of the group of memory elements at the mounting position C, wherein a CLK signal has a cycle of 15 ns. The time period RCD from an ACT signal to an RD signal is 30 ns; CL from the RD signal to output of RAM data is 30 ns; and FT from the output of the RAM data to fetch of the RAM data is 10 ns.

Figure 5B:
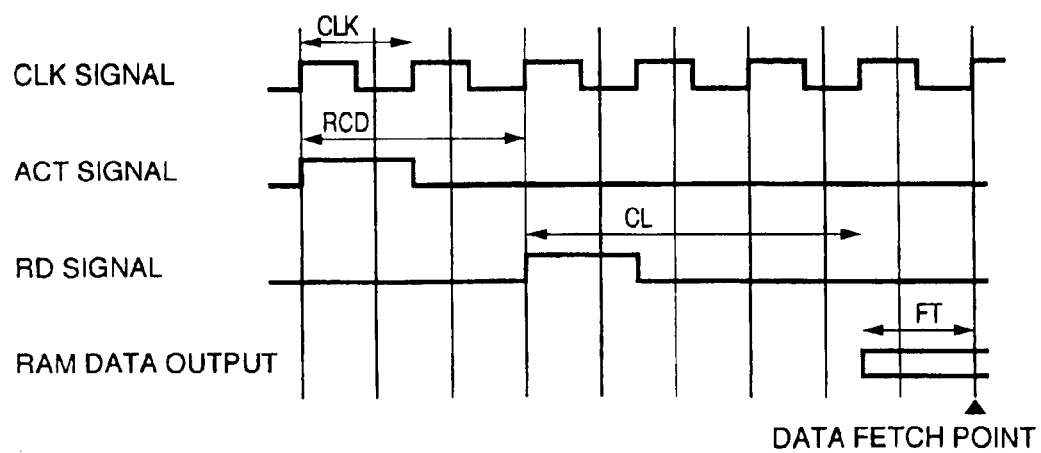

FIG. 5B shows operation timings of the group of memory elements at the mounting position D, wherein a clock signal has a cycle of 15 ns. The time period RCD from an ACT signal to an RD signal is 30 ns; CL from the RD signal to output of RAM data is 45 ns; and FT from the output of the RAM data to fetch of the RAM data is 15 ns.

As described above, according to the embodiment of the present invention, each group of memory elements can be controlled at an optimal timing based on the positions at which groups of memory elements are mounted in the memory unit, and an operating speed of each group of memory elements.

While the foregoing embodiment of the present invention has been described on the assumption that the groups of memory elements mounted in the memory unit are SDRAMs, the present invention can be applied to a memory unit which is mounted with a mixture of memory elements different in specifications such as DRAM, SRAM and so on, in which case each group of memory elements can be controlled at an optimal timing based on the position at which each group of memory elements is mounted in the memory unit, and the type of each group of memory elements.

Further, according to the foregoing embodiment of the present invention, since the timings for the groups of memory elements can be changed based on a situation in which a fault has occurred, the operation of the memory unit can be controlled so as to avoid a fault which could occur only under particular conditions.

As described above, according to the present invention, in an information processing system equipped with large scaled memory elements, a memory controller can self-detect mounting positions of groups of memory elements and a change in the actual performance of the memory elements due to environmental change, aging change, and so on to stably operate the memory elements at their highest possible performance without shutting down the system.

What is claimed is:

1. An information processing system comprising:
a memory unit; and
a memory controller,
wherein said memory controller comprises:
storing means for storing changeable memory control timing information,
monitoring means for monitoring an operating state of said memory unit,
a register for setting therein the memory control timing information from said memory control timing information storing means, and
control means for controlling an access timing to said memory unit based on the memory control timing information in said register and for dynamically changing, during operation of said memory unit, the information stored in said memory control timing information storing means based on information from said monitoring means.

2. A system according to claim 1, wherein said memory unit includes a mixture of a plurality of groups of memory elements different in operation, and
wherein said storing means stores the memory control timing information corresponding to each of said groups of memory elements.

3. An information processing system comprising:
a memory unit; and
a memory controller,
wherein said memory controller comprises:
storing means for storing changeable memory control timing information,
monitoring means for monitoring an operating state of said memory unit,
a register for setting therein the memory control timing information from said memory control timing information storing means, and
control means for controlling an access timing to said memory unit based on the memory control timing information in said register and for dynamically changing the information stored in said memory control timing information storing means based on information from said monitoring means,
wherein said memory unit comprises:
an environmental sensor for monitoring a temperature and a current, and
wherein said control means updates information stored in said storing means so as to delay an operation timing to said memory unit in response to a notification indicating that a temperature rise around said memory unit or a current value from said environmental sensor exceeds a reference value.

4. An information processing system comprising:
a memory unit; and
a memory controller,
wherein said memory controller comprises:
storing means for storing changeable memory control timing information,
monitoring means for monitoring an operating state of said memory unit,
a register for setting therein the memory control timing information from said memory control timing information storing means,
control means for controlling an access timing to said memory unit based on the memory control timing information in said register and for dynamically changing the information stored in said memory control timing information storing means based on information from said monitoring means, and
a memory fault detector circuit, and
wherein said control means, in response to a detection by said detector circuit that a particular group of memory elements fails, updates stored information corresponding to said group of memory elements in said storing means so as to delay an operation timing to said memory unit.

5. An information processing system comprising:
a memory unit; and
a memory controller,
wherein said memory controller comprises:
storing means for storing changeable memory control timing information,
monitoring means for monitoring an operating state of said memory unit,
a register for setting therein the memory control timing information from said memory control timing information storing means,
control means for controlling an access timing to said memory unit based on the memory control timing information in said register and for dynamically changing the information stored in said memory control timing information storing means based on information from said monitoring means, and
a memory fault detector circuit, and
wherein said control means, in response to a detection by said detector circuit that a particular group of memory elements fails and that the fault has degraded performance in a particular operation, updates stored information corresponding to said group of memory elements in said storing means so as to delay an operation timing to said memory unit.

6. A memory controller for use in an information processing system and being adapted for connection with a processor and a memory unit, said memory controller comprising:
storing means for storing changeable memory control timing information;
monitoring means for monitoring an operating state of said memory unit to issue information related with said operating state;
a register for setting therein memory control timing information from said memory control timing information storing means; and
a control circuit for controlling an access timing of said memory unit based on the memory control timing information in said register and for dynamically changing, during operation of said memory unit, the information stored in said memory control timing information storing means based on operating state information from said monitoring means.

7. A memory controller for use in an information processing system and being adapted for connection with a processor and a memory unit, said memory controller comprising:
storing means for storing changeable memory control timing information;
monitoring means for monitoring an operating state of said memory unit to issue information related with said operating state;
a register for setting therein memory control timing information from said memory control timing information storing means; and
a control circuit for controlling an access timing of said memory unit based on the memory control timing information in said register and for dynamically changing the information stored in said memory control timing information storing means based on operating state information from said monitoring means,
wherein said memory unit includes an environmental sensor, and
wherein said change control circuit changes said timing information stored in said timing information storing means based on environmental data on said memory unit from said environmental sensor.

8. A memory controller for use in an information processing system and being adapted for connection with a processor and a memory unit, said memory controller comprising:
storing means for storing changeable memory control timing information;
monitoring means for monitoring an operating state of said memory unit to issue information related with said operating state;
a register for setting therein memory control timing information from said memory control timing information storing means; and
a control circuit for controlling an access timing of said memory unit based on the memory control timing information in said register and for dynamically changing the information stored in said memory control timing information storing means based on operating state information from said monitoring means, and
wherein said environmental data on said memory unit from said environmental sensor includes a change in temperature around said memory unit, and a current value of said memory unit.

9. A memory controller according to claim 6, wherein said memory unit includes a mixture of a plurality of groups of memory elements different in operation; and
wherein said timing information storage means stores memory control timing information corresponding to each said group of memory elements.

10. A memory controller for use in an information processing system and being adapted for connection with a processor and a memory unit, said memory controller comprising:
storing means for storing changeable memory control timing information;
monitoring means for monitoring an operating state of said memory unit to issue information related with said operating state;
a register for setting therein memory control timing information from said memory control timing information storing means; and
a control circuit for controlling an access timing of said memory unit based on the memory control timing information in said register and for dynamically changing the information stored in said memory control timing information storing means based on operating state information from said monitoring means,
wherein said monitoring means includes a memory fault detector circuit for detecting a fault in a particular group of memory elements to output information indicative of the fault, and
wherein said change control circuit changes stored timing information corresponding to said group of memory elements in response to the output information from said memory fault detector circuit.

11. A memory controller according to claim 10, wherein the fault detected by said fault detector circuit is degraded performance in a particular operation of a group of memory elements.

* * * * *